United States Patent [19]
Willeke et al.

[11] Patent Number: 5,704,992
[45] Date of Patent: Jan. 6, 1998

[54] SOLAR CELL AND METHOD FOR MANUFACTURING A SOLAR CELL

[76] Inventors: Gerhard Willeke, Hegaublick 8, D-78534, Konstanz; Peter Fath, Hintere Lehren 1, D-88709, Meersburg, both of Germany

[21] Appl. No.: 592,327

[22] PCT Filed: Jul. 25, 1994

[86] PCT No.: PCT/DE94/00860

§ 371 Date: Mar. 26, 1996

§ 102(e) Date: Mar. 26, 1996

[87] PCT Pub. No.: WO95/05008

PCT Pub. Date: Feb. 16, 1995

[30] Foreign Application Priority Data

Jul. 29, 1993 [DE] Germany ............ 43 25 407.1

[51] Int. Cl.⁶ .................. H01L 31/06; H01L 31/18
[52] U.S. Cl. .................. 136/255; 136/256; 437/2; 437/249
[58] Field of Search ............... 136/255, 256; 437/2.4–2.5, 180, 204, 225, 228–229, 249

[56] References Cited

U.S. PATENT DOCUMENTS

| | | | |
|---|---|---|---|
| 4,227,942 | 10/1980 | Hall | 136/255 |
| 4,453,030 | 6/1984 | David | 136/256 |
| 4,608,451 | 8/1986 | Landis | 136/256 |
| 4,886,555 | 12/1989 | Hackstein et al. | 136/255 |
| 5,024,953 | 6/1991 | Uematsu et al. | 437/2 |

FOREIGN PATENT DOCUMENTS

| | | | |
|---|---|---|---|
| 40 33 658 | 4/1992 | European Pat. Off. | |
| 0 548 863 | 6/1993 | European Pat. Off. | 136/256 |
| 2 489 597 | 3/1982 | France | 136/256 |
| 2-51 282 | 2/1990 | Japan | 136/256 |

OTHER PUBLICATIONS

G. Willeke et al, *Solar Energy Materials and Solar Cells*, vol. 26, pp. 345–356 (1992).
R.F. Overstraeten, R.P. Mertens, "Physics; Technology Use of Photovoltaics", Adam Hilger, Bristol, 1986, 148–150.
M.A. Green, "High Efficiency Silicon Solar Cells", Trans Tech Publications, Kensington (NSW) 1987, pp. 208–213.
A. Wang, J. Zhao, M.A. Green, Appl. Phys. Letter (57(6) 1990, pp. 602–604.
J. Wohlgemuth, A. Scheinine, Proc. 14th IEEE Pvsc, San Diego, 1980, pp. 151–153.
J.S. Culik, E.L. Jackson, A.M. Barnett, Proc. 20th IEEE PVSC, Kissimimee 1990, pp. 251–256.
S.Narayanan, J.Zolper, F. Yun, S.R.Wenham, A.B.Sproul, C.Chong, M.A.Green, Proc. 20th IEEE PVSC, Kissimimee 1990 pp. 678–680.
T.Okuno, S.Moriuchi, K.Nakajimy, Y.Yokosawa, K.Okamoto, T. Nunoi, H.Sawai, Proc. 11th EEC PVSEC, Montreux, 1992, pp. 408ff.
KFK News, vol. 23, 203/91, pp. 165–173.

(List continued on next page.)

*Primary Examiner*—Aaron Weisstuch
*Attorney, Agent, or Firm*—Baker & Daniels

[57] ABSTRACT

A solar cell comprising a substrate on which grooves are formed on the from and back sides thereof. The grooves on the front side are disposed in order to inscribe an angle with respect to the grooves on the back side. The intersection of the grooves on the from side and the back side form a plurality of through holes which form a grid pattern. Also disclosed is a method for producing a flat component with a grid of through holes (7). To produce the through holes (7), a plurality of generally equidistant, parallel V-shaped grooves (8) are formed on the from and back sides of a wafer. The grooves (8) on the two sides inscribe an angle relative to one another and are sufficiently deep for the through holes (7) to be automatically created at the intersections of grooves (8). The method is suitable for producing high efficiency solar cells.

14 Claims, 9 Drawing Sheets

OTHER PUBLICATIONS

R.M. Hall, T.J. Soltys, Proc. 14th IEEE PVSC, San Diego, 1980, pp. 550–553.

M.A. Green, High Efficiency Silicon Cells, Trans Tech. Publications, Kensington NSW 1987, pp. 189–191, p. 216.

M.A. Green, High Efficiency Silicon Cells, Trans Tech Publications, Kensington NSW 1987, p. 171.

IBM Technical Disclosure Bulletin, vol. 21, Nr.6, Nov. 1978, T.S. Kuan et al, pp. 2585–2586.

Applied Physics Letters, vol. 62, Nr. 23, 07 Jun. 1993, H. Bender et al, pp. 2941–2943.

Applied Physics Letters, vol. 64, Nr. 10, 07 Mar. 1994, G. Willeke et al, pp. 1274–1276.

12th European Photovoltaic Solar Energy Conference 11 Apr. 1994, G. Willeke et al, pp. 766–768.

Solar Energy Materials and Solar Cells, vol. 26, 1992, pp. 345–356.

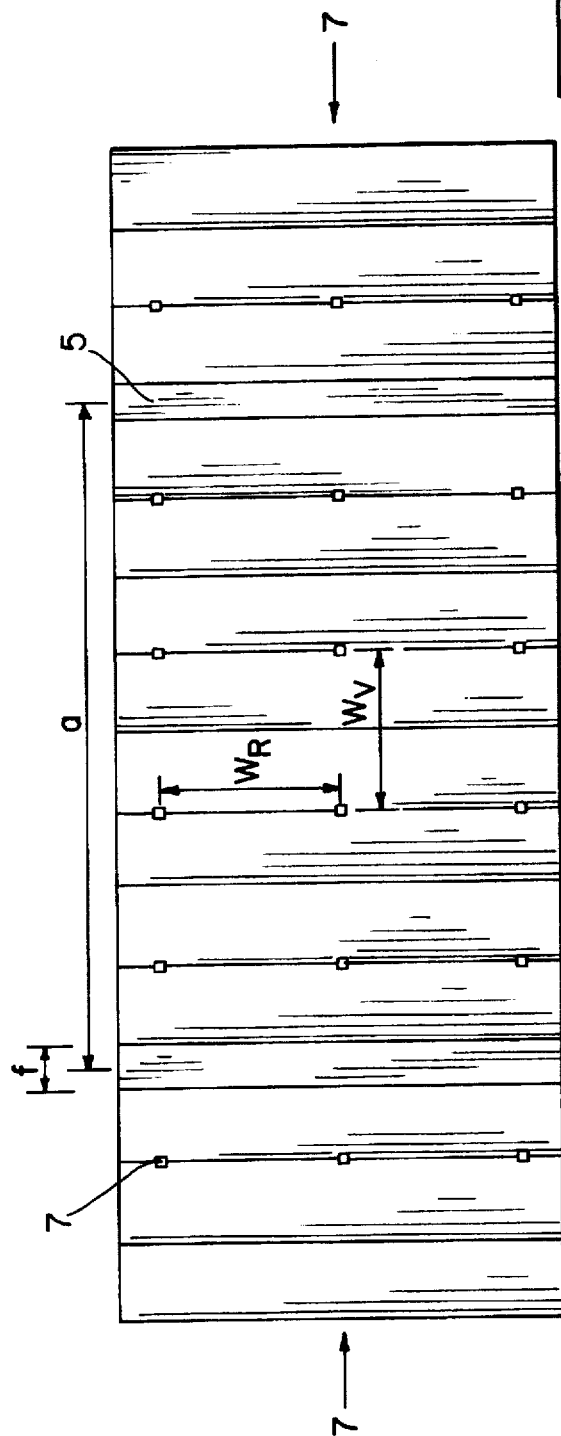
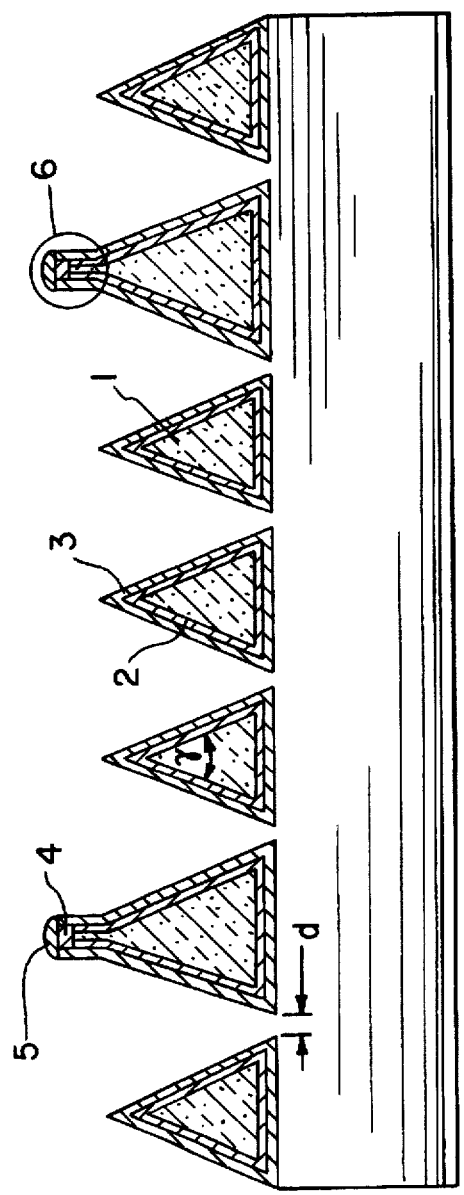

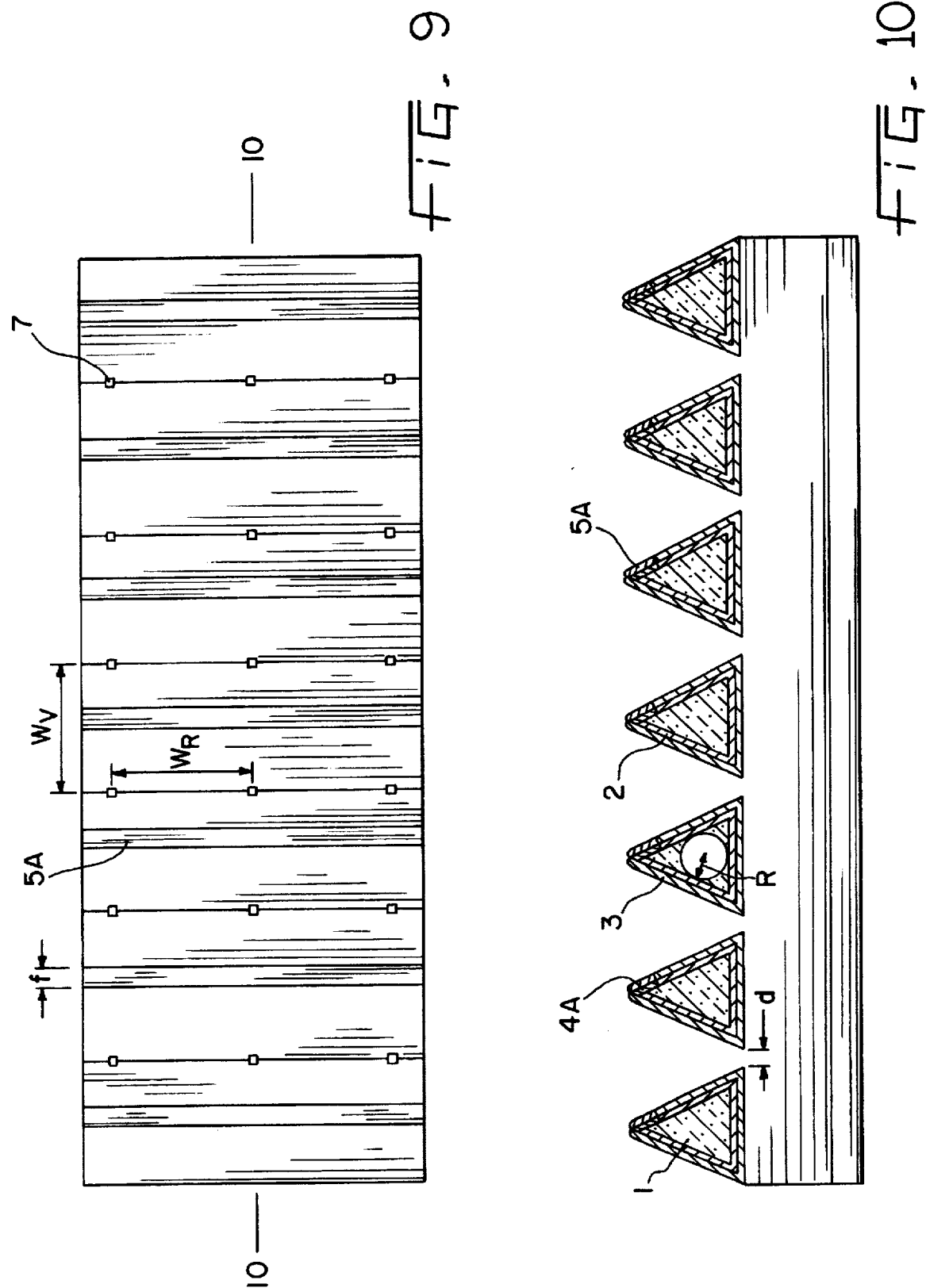

SOLAR CELL AND METHOD FOR MANUFACTURING A SOLAR CELL

BACKGROUND OF THE INVENTION

1. Field of the Invention

The invention relates to solar cells and a method for producing solar cells.

2. Description of the Related Art

Various solar cells and methods of manufacturing solar cells are disclosed in the following previously published documents:

IBM Technical Disclosure Bulletin (D1) vol. 21, No. 6, November 1978, pp. 2585–2586;

Applied Physics Letters (D2) vol. 62, No. 23, June 1993, pp. 2941–2943; and

EP-A-548 863 (D3).

Document D1 discloses a substrate having a grid formed by V-shaped grooves which are created by means of an anisotropic etching process using photolithographic steps. In particular, D1 discloses differential etching to produce an array of ink jet nozzles. Lithography is used to define the position of the nozzles on the silicon wafer. As shown in FIG. 2, a differential etch may be applied to one side of the wafer and the same etching applied to the other side of the wafer. The etching produces grooves in the shape of a truncated pyramid.

Document D2 discloses mechanical surface structuring which provides V-shaped grooves on a substrate surface wherein the working solar cell is prepared by mechanically texturing the surface. The grooves on the surface are formed using a conventional silicon dicing saw and beveled blades may be used. Document D2 discloses that the mechanical structuring used therein is similar to a previous technique, but that beveled blades rather than rectangular blades are used. Following the mechanical structuring, the sawing damage is removed using various etchants. However, document D2 discloses surface structuring limited to only one side of a silicon wafer.

The same feature also applies to the solar cells disclosed in document D3, namely surface structuring limited to only one side of the silicon wafer.

One aspect of the manufacturing technology disclosed by document D1 is that creating grooves on a substrate by means of an anisotropic etching process is very time-consuming and subject to geometric limitations. As noted in document D1, the etching process may also result in cracks and defects, depending on the geometry of the nozzles. As to documents D2 and D3, the solar cells disclosed therein are structured on only one side of the wafer and as such are one-sidedly effective. Transferring the principle known from document D1 for creating a grid to solar cells according to documents D2 and D3 encountered considerable technical reservations, particularly due to the thin components to be processed.

Therefore, what is needed is high efficiency solar cells which can be easily produced from thin components wherein the entire volume of the solar cells is efficiently utilized rather than only a portion of the volume associated with a particular side of the substrate wafer. What is also needed is a method of quickly and easily producing high efficiency solar cells without geometric limitations on the surface structure.

SUMMARY OF THE INVENTION

The present invention provides solar cells which are structured to allow double-sided utilization of the solar cells to thereby increase the efficiency of the solar cells. The present invention also provides a method for quickly and easily producing such high efficiency solar cells.

In particular, an object of the present invention is to provide a high efficiency solar cell which is easily manufactured using various processing methods. The present solar cell is formed on a substrate, for example on a semiconductor wafer, in which charge carriers can be generated by the energy of incident rays, which charge carriers can be separated by an electrical field and thereafter dissipated via electrically conducting contacts. The high efficiency solar cell of the present invention incorporates a double sided structure having a plurality of grooves formed on the two sides of the solar cell. The plurality of grooves on the two sides of the solar cell form a grid pattern of regularly arranged through holes. The plurality of grooves are generally equidistant, parallel and V-shaped, although other groove profiles and arrangements are possible as described further below, with the grooves on the two sides of the solar cell inscribing an angle relative to each other. The grooves are sufficiently deep for creating a plurality of through holes at the intersections of the grooves.

Another object underlying the present invention is to propose a method for easy, low-cost manufacture of the solar cells of the present invention at high production rates, the efficiency of which cells is increased considerably due to the double-sided structuring.

This objective is accomplished in a method wherein a plurality of grooves are formed on the front and back of a semiconductor substrate in preferably equidistant and parallel manner, such that the grooves are aligned and dimensioned so as to inscribe on both sides of the semiconductor substrate an angle relative to one another and have a depth such that through holes are automatically created at the intersections of the grooves on the front and back side to form a grid pattern. Thus, the present method of the invention allows the manufacture of solar cells which are considerably more efficient than prior solar cells.

Owing to the great number of freely selectable parameters and the plurality of materials suited for processing, the present method offers a superior design variety in the manufacture of the basic grid patterns of the present solar cell.

The generally V-shaped grooves are created in the base element by means of a saw blade having a pointed profile and rotating at high speed. This method is especially favorable in view of the universality of the materials suited for processing and the possible variety in the make-up of grooves and through holes and, thus, of the grid patterns. The applicational accuracy of modern sawing machines assures the creation of grids with a correspondingly high precision. Through hole diameters up to 5 µm are possible especially with the use of pointed saw blades, the minimum hole diameter being limited merely by the grain size of the abrasive of the saw blades. The rate of production can be boosted by mounting several saw blades on one spindle.

The grooves may also be produced by another mechanical method, notably by means of a saw type forming element rotating at high speed. Such a saw type forming element consists of a roll-shaped element which features the negative profile of the grooves and is coated with an abrasive. Using such a saw type forming roll enables a high rate of production of the present grid type solar cell elements and has the advantage of an inexpensive mounting and relatively low cost compared to saw blades. The roll-shaped element may consist of metal (e.g., soft steels, aluminum, bronze, etc.), but other materials, notably ceramics and special plastics, may be used as well. Lastly, direct fabrication of a structuring roll of the respective abrasive is also conceivable, e.g., diamond, boron nitride, silicon carbide etc.

As mentioned already, the present invention also relates to a high-efficiency solar cell, with a grid pattern of through holes which are created by producing on the front and back side of a substrate wafer a plurality of preferably equidistant, parallel and generally V-shaped grooves, with the grooves of the two sides inscribing an angle relative to one another and being sufficiently deep for the through holes to be created automatically at the intersections of the grooves.

The solar cell of the present invention may be made from a base of a crystalline silicon wafer and features on the front and back side, except on the contact zones, a whole-area emitter coating, the emitter coatings of the front and back side being electrically connected by way of the through holes.

When using polycrystalline silicon wafers as base material for photovoltaic energy generation, high efficiency is impeded by the typically relatively slight diffusion length of the minority charge carriers and by the low absorption coefficient of silicon. Only relatively small crystallite sizes, and thus diffusion lengths, are accomplished especially with the modern, low-cost slab casting method, due to process engineering.

To ameliorate the two major causes of the small diffusion length of the minority charge carriers, recombination of grain boundaries and contaminations, the polycrystalline silicon substrates are in the course of the solar cell production process subjected to hydrogen treatment and/or to a phosphorus getter step (1), (2). But the results are usually limited. Therefore, obtaining a maximally coarse crystalline, pure material is primarily attempted by improving the customary block casting method.

To solve the problem of the low absorption coefficient of silicon, various methods for better capturing of the incident light have been developed in the past.

Presently, besides the application of antireflection coatings, methods are primarily applied where the surface of the silicon base material is structured.

In the case of monocrystalline silicon, irregularly distributed pyramids, ordered patterns of inverted pyramids (3), laminar structures (4) or V-shaped grooves (5) are created with the aid of the anisotropic etching behavior of organic as well as alkaline etch solutions and, as the case may be, in combination with preceding photolithographic process steps.

Owing to the irregular distribution of crystallites of most varied crystal orientation in polycrystalline silicon wafers, the above-cited methods did not show entirely satisfactory results. As alternative structuring methods, .prior art surface texturings were created with the aid of lasers (6) or conventional silicon wafer saws equipped with nonpointed or pointed cut-off saw blades (7), (8). The surface texture was always produced on the side of the solar cell facing sunlight.

With the present solar cell it is for the first time possible to provide a high efficiency solar cell of crystalline, notably finely crystalline and direct-cast silicon wafers, and at that, despite the relatively small diffusion length of the minority charge carriers in polycrystalline silicon and despite the low absorption coefficient of these materials. Using the present methods, a high efficiency solar cell can be made:

- of monocrystalline silicon wafers as well as of polycrystalline silicon base material of structurally and electronically lesser quality;
- by a simple manufacturing method using a saw type forming element which rotates at high speed and is equipped with pointed profiles, with only few sequential process steps;
- with efficiency in the photovoltaic energy conversion;
- with both sides of the cell photosensitive; and
- with low weight;

the resulting solar cell being controllable in its transparency.

Due to the cited advantages, the present high efficiency solar cell of crystalline silicon wafers is uniquely suited for large-area terrestrial use. Additionally an interesting possible application of this technology to monocrystalline silicon is extraterrestrial use, with particular allowance for the weight advantage and good radiation tolerance to be expected.

Further specific areas of application may be derived from utilizing the transparency controlled by the size of the holes. For example, the present solar cell can be employed both in commercial window coverings and in the consumer sector in automotive sun roofs or as integral component of facade liners.

In a preferred embodiment of the present high efficiency solar cell, the solar cell surface is passivated throughout, except for the contact zones.

The ridges between the grooves may be $n^{++}$-doped or $p^{++}$-doped in alternating succession.

In a particularly favorable variant of the present high efficiency solar cell, the grooves on the back side are arranged so that they inscribe in alternating fashion, on their one or other end, an acute angle with the adjacent groove, thus creating a continuous, zig-zag groove, with the ridges between adjacent grooves extending to a point at their end facing the groove angle. In carrying out contact finger diffusion where the silicon ridges extending laterally in a point, of one side, are $n^{++}$-doped while the ridges of the opposite side are $p^{++}$-doped, a meshing contact finger arrangement of alternating charge carrier type ($n^{++}$-$p^{++}$-$n^{++}$), favorable for back-bonded solar cells, is achieved.

A bus bar may be provided on the (respective) outer edge of the back side of the solar cell having the contact finger arrangement described above to greatly simplify the electrical connection of individual contact fingers of same charge carrier type.

With the aforementioned bonding pattern it is possible to easily produce back-contacted solar cells where the current-collecting metal contacts are contained entirely on the back side. This arrangement offers the advantage of the nonoccurrence of reflection losses as compared to a cell metallization on the front side.

The present invention also provides a method for bonding the present high efficiency solar cell characterized in that the protruding ridges that extend between the grooves are metallized.

This method preferably encompasses a procedure in which a roll type element coated with a metallic paste is rolled across the protruding ridges. This roll printing method is additionally suited for application of dopant-containing paste for selective contact diffusion ($n^{++}$ and $p^{++}$) as well as etching agents for selective opening of a passivation oxide or nitride layer.

In a particularly preferred variant of the present bonding method, a photoresist is applied, exposed obliquely at a preferably small angle, whereafter the exposed photoresist is removed and metallization is then carried out within the openings thus produced on top of the grooves.

Prior to metallization of the contact strips, a heavy n-diffusion, or p-diffusion, should be carried out in the opened areas.

If desired, or even necessary, the metallized contact strips can also be fashioned exclusively on the back side of the solar cells.

BRIEF DESCRIPTION OF THE DRAWINGS

The invention is explained more fully hereafter with the aid of exemplary embodiments which in part are illustrated in the drawings, wherein:

FIG. 6 shows a plan view of a section of a solar cell according to embodiment I;

FIG. 7 shows a cross-sectional view of a solar cell according to embodiment I along line 7—7 in FIG. 6;

FIG. 9 shows a plan view of a section of a solar cell according to embodiment II;

FIG. 10 shows a cross-sectional view of a solar cell according to embodiment II along line 10—10 in FIG. 9;

DETAILED DESCRIPTION OF THE INVENTION

Figure 5:
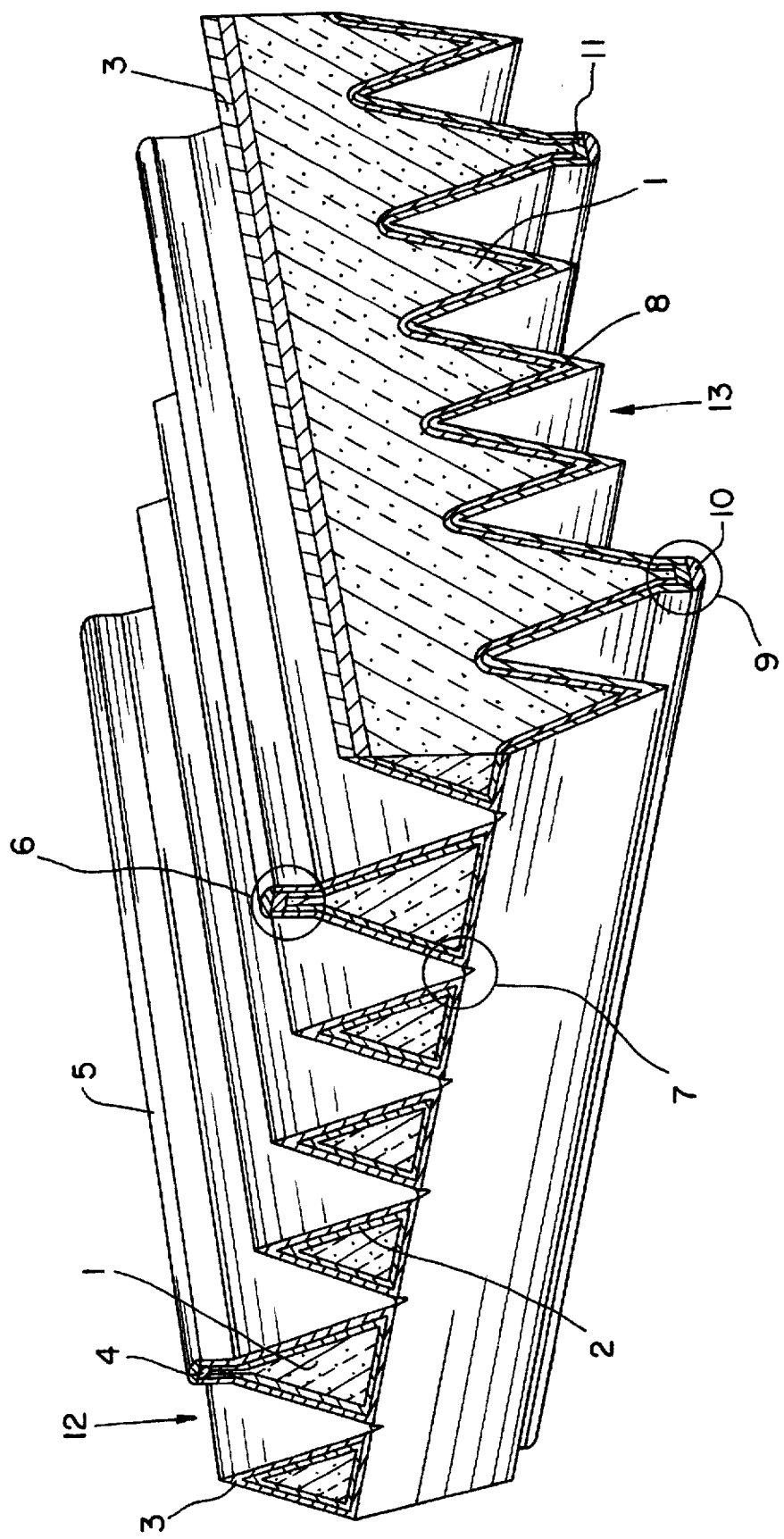
FIG. 5 shows a perspective sectional view of a finished solar cell according to embodiment I.
Figure 8:
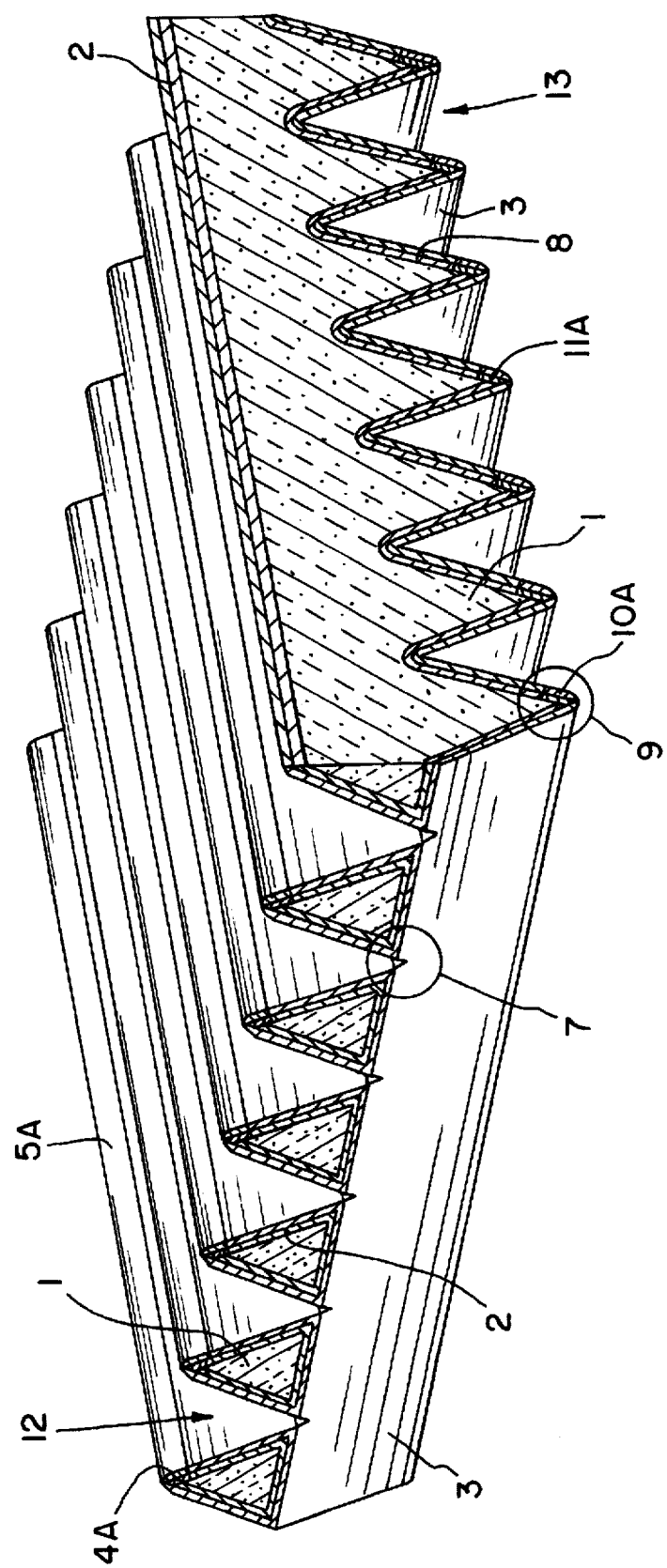
FIG. 8 shows a perspective sectional view of a finished solar cell according to embodiment II.
Figure 11:
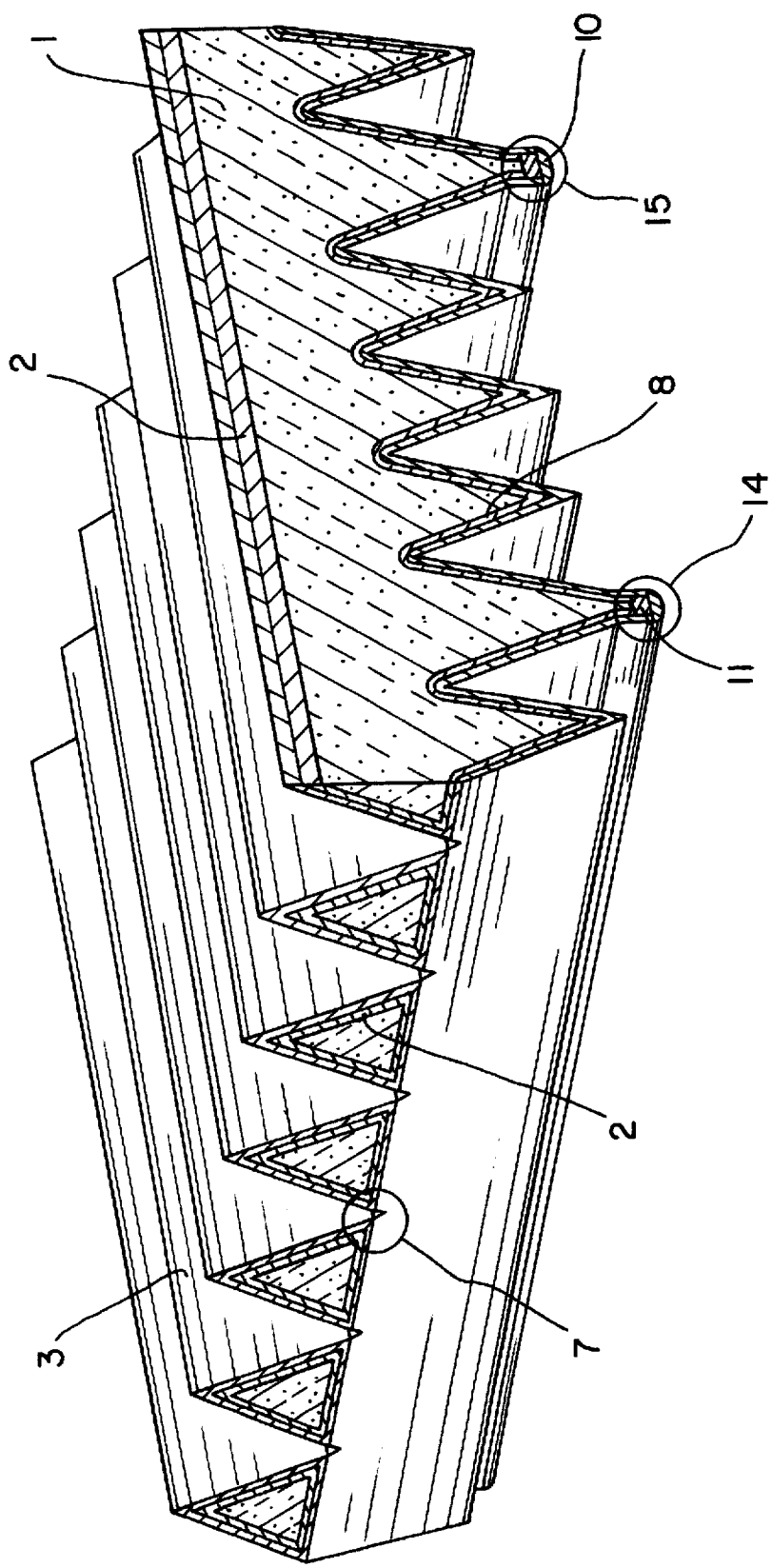
FIG. 11 shows a perspective sectional view of a finished solar cell according to embodiment III.
Figure 12:
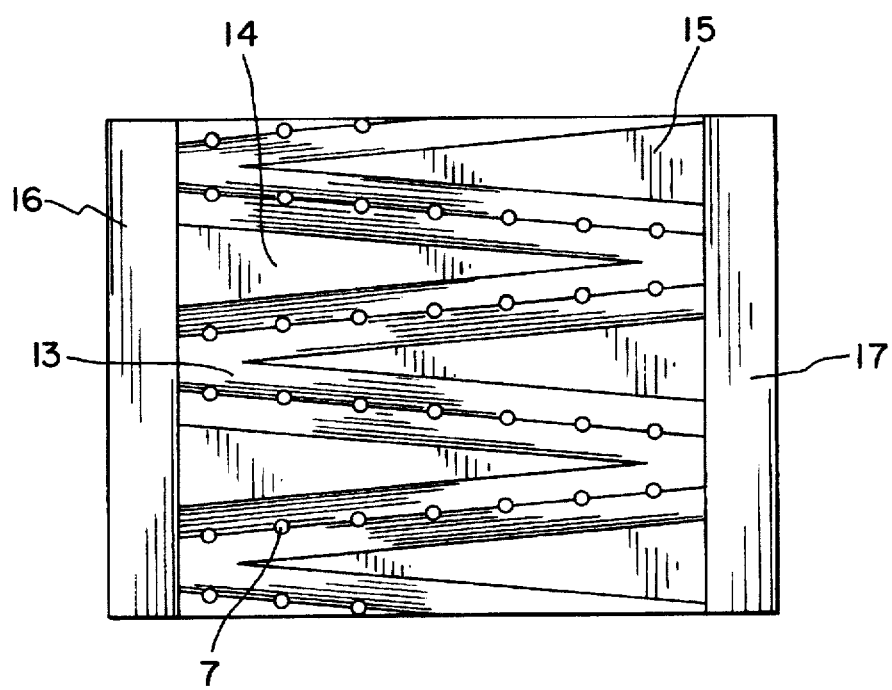
FIG. 12 shows a plan view of the back side of a solar cell according to embodiment III.

The solar cell of the present invention is now described with references to FIGS. 5–12, wherein FIGS. 5–7 illustrate embodiment I, FIGS. 8–10 illustrate embodiment II, and FIGS. 11–12 illustrate embodiment III. As shown in FIGS. 5–12, the solar cells of each embodiment include a number of common features. In particular, each solar cell comprises substrate wafer 1 on which a plurality of grooves 12 are formed on one side and a plurality of grooves 13 are formed on the other side. Although grooves 12, 13 are shown as having a V-shaped profile, it is to be understood as described below, that a variety of profile shapes may be used. Grooves 12, 13 are formed to inscribe an angle with respect to each other such that holes 7 are formed by the intersection of grooves 12, 13. As also described below, grooves 12, 13 may be produced with various profiles to produce differing sizes, shapes and arrangements of holes 7.

As shown in FIGS. 6 and 9, holes 7 form a grid pattern on substrate wafer 1 wherein holes 7 in a particular groove are separated by a distance $W_R$, and holes 7 in one groove are separated from holes 7 in an adjacent groove by a distance $W_V$. As shown in FIG. 12, the zig-zag pattern of grooves 13 in embodiment III produces a zig-zag pattern of holes 7.

Emitter coating 2 is formed on the surface of substrate wafer 1 except on the contact areas formed on substrate wafer 1 as described further below. Oxide layer 3 is further formed on emitter coating 2. As described further below, the formation of grooves 12, 13 on both sides of substrate wafer 1 increases the efficiency of the present solar cells.

Contact areas are also formed on the solar cells shown in FIG. 5–12. In embodiment I, front contact ridges 6 are formed on selected ridges between grooves 12 one side of substrate wafer 1 and back contact ridges 9 are formed on selected ridges between grooves 13 on the other side of substrate wafer 1. Front contact ridges 6 include doped zone 4 in contact with contact finger 5, and back contact ridges 9 include doped zone 11 in contact with contact finger 10.

In embodiment II, the contact includes n++ coating 4A formed on the solar cell after a portion of emitter coating 2 has been removed and contact finger 5A is further formed thereon on the front side. The back side includes p++ coating 11A and contact finger 10A.

In embodiment III, the contact includes n++ doped contact ridges 14 and p++ doped contact ridges 15 formed on one side of substrate wafer 1. As shown in FIG. 12, grooves 13 are formed in a zig zag fashion to produce contact ridges 14, 15 of alternating charge carrier type. This contact ridge arrangement is obtained by first fashioning V-shaped grooves 13 that extend parallel to one another. Next, a second set of parallel grooves 13 is created, with the direction of the grooves 13 created in the first structuring step inscribing an angle with the grooves 13 of the second structuring step. During the contact finger diffusion, contact ridges 14 are $n^{++}$-doped while the opposite set of ridges 15 are $p^{++}$-doped to form a contact ridge arrangement suitable for back contact solar cells having meshing contacts of alternating charge carrier type ($n^{++}$-$p^{++}$-$n^{++}$). The electrical connection of the individual contact ridges 14, 15 of same charge carrier type is greatly simplified by application of bus bars 16, 17 disposed on the edges of substrate wafer 1.

Possible configurations and arrangements of grooves 12, 13 and holes 7 on substrate wafer 1 are now discussed. When fashioning in the substrate wafer 1 equidistant and parallel grooves 12, 13, where the grooves inscribe an angle of 90° and are equally spaced, a grid pattern having a base element of a quadratic, uniform cell of holes 7 is obtained as shown in FIGS. 6 and 9. With the grooves 12, 13 of the two sides differing in their spacing, the uniform cell of holes 7 is rectangular. With the grooves 12, 13 of the two sides inscribing an angle other than 90°, parallelograms are obtained as the base elements of the grid. It can be seen that when grooves 12, 13 on one or both sides of substrate wafer 1 inscribe an angle relative to one another, extensive arrangements of holes can be created to form uniform cells within the grid, other than trapezoids or triangles.

The size and shape of holes 7 depend on the cross-sectional shape and dimensions of grooves 12, 13. When using grooves with rectangular cross-sectional shapes, the size and shape of holes 7 are directly governed by the width of grooves 12, 13 on the front and back side. Grooves 12, 13 of equal width on both sides of substrate wafer 1 produce at their intersections quadratic holes 7 where the width of grooves 12, 13 equals the length of edges of holes 7. Rectangular hole shapes are created with differing groove widths. When using V-shaped groove profiles, diamond-shaped holes 7 are obtained whose size increases with the depth of the grooves on the front and back side 12, 13. Rounded groove profiles produces holes 7 having round hole shapes. The perforated area coverage relative to the overall wafer area can be adjusted selectively over broad ranges, depending on application, by shaping and dimensioning the groove spacing and hole size as necessary. The limit on the perforation area coverage is determined by the required mechanical stability of the solar cell.

Some methods for producing grooves 12, 13 on substrate wafer 1 are now discussed with reference to FIGS. 1–4. Possible methods for creating the grooves 12, 13 depend on the type of material used and the dimensions of the grids to be created.

With monocrystalline semiconductor materials, notably silicon, as base material, grooves 12, 13, specifically with V-shaped profiles, can be fashioned in the wafer base, utilizing the anisotropic etching behavior of alkaline and organic etches and incorporating photolithographic process steps.

Figure 1:
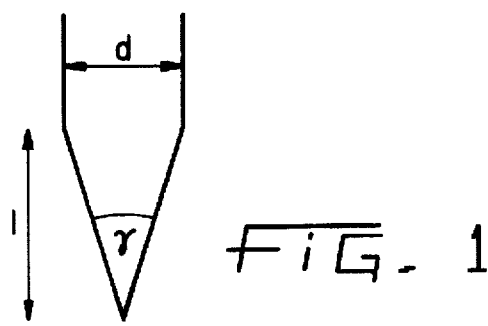
FIG. 1 shows a saw blade with a flat-face profile and an acute angle.

In mechanical fashioning wherein saw type forming elements rotating at high speed are used, commercially available disk-shaped saw blades are mounted on a high-speed spindle, preferably of an automatic precision sawing machine. When operating in single blade mode, the grooves 12, 13 required for making the grid pattern on a wafer base are fashioned cut by cut by scanning the saw blade rotating at up to 30,000 rpm at a constant feed across the wafer base. A profile of a typical saw blade is shown in FIG. 1 wherein the saw blade has a thickness d, angled length 1, and point angle γ. Minimum cutting depths and spacings up to 0.1 µm with a repeat accuracy of 1 µm are possible with presently available commercial sawing machines. The angle inscribed by two successive cuts can be adjusted between 0° and 90° with an accuracy of 0.001°. The feed velocity of the saw blade in scanning may range up to 300 mm/s. Materials for which the saw blades are presently offered for cutting come under the large class of short-chipping materials. They include all popular semiconductor materials, notably silicon, ceramic, ferrites, glasses, precious stones and all short-chipping metals, such as molybdenum, titanium, etc. In addition to the cut-off saw blades with a flat-face profile (point angle: 180°), V-shaped pointed saw blades are offered with tip angle freely selectable across a broad range of angles. The commercially available cut-off saw blades have minimal thicknesses up to 7 µm, whereas profiled saw blades are presently available with minimal thicknesses up to 100 µm. To boost throughput in the production, the multiple blade method is employed, with up to 100 saw blades mounted on one spindle.

With the method employing structuring rolls, a roll type element is provided across the entire circumference and entire length of a base material, optionally by means of precision mechanics methods, with the negative profile of the future groove structure and subsequently coated with abrasive grains (e.g., consisting of diamond, boron nitride, silicon carbide etc.). Suitable base materials for the base element are metals (e.g., soft steels, aluminum, bronze, etc.) but also ceramics and special plastics. It is also possible to fashion the structuring roll directly from the respective abrasive.

Figure 2A:
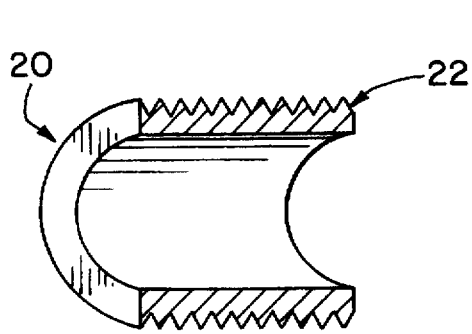
FIGS. 2a–b show sectional views of two structuring rolls.
Figure 2B:
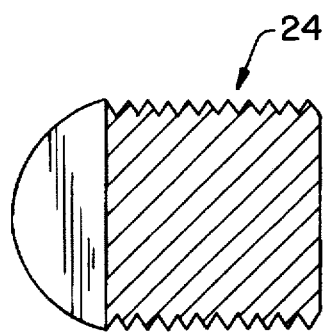
Figure 3:
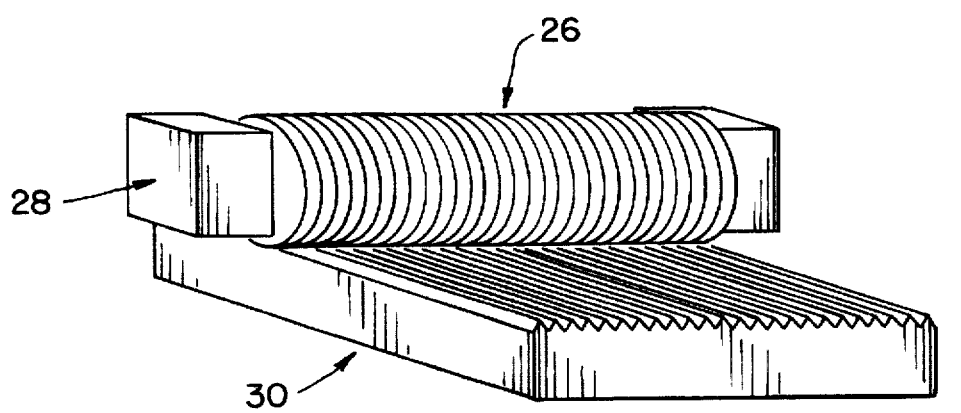
FIG. 3 shows an illustration of the roll printing method.

FIG. 2a shows a sectional view of structuring roll 20 with a negative profile consisting of V-shaped grooves 22. The structuring roll 20 can be mounted on a flange of a spindle rotating at high speed. Structuring roll 24 with a solid body as shown in FIG. 2b would be joined, via two suspension points, directly to the drive unit of a high-speed motor. The diamond cutting method developed by Bier et al. (9) for micromechanical machining of metal elements suggests itself generally for creating the V-shaped grooves, respectively the negative profiles in the structured rolls, in which method structures in the range of minimally 10 µm are cut, in a metal body rotating at high speed, with the aid of a precision-ground diamond mounted on a CNC-controlled XYZ-table. The metal roll profiled in this manner is subsequently coated with abrasive grains. This may be carried out electrochemically using commercial techniques, where one or several 10-µm coats of diamond powder embedded in a binder matrix (for instance nickel) are applied. Coating by means of sintering is conceivable as well. As schematically illustrated in FIG. 3, an appropriately long structuring roll 26 mounted on spindle 28 rotating at high speed would be suited to structure one side of a solar cell 30 in a single step.

Figure 4:
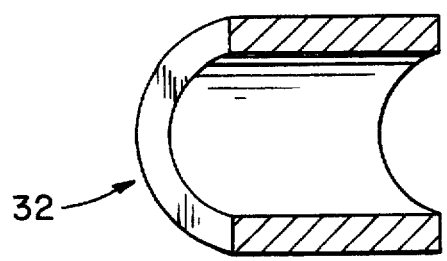
FIG. 4 shows a structuring roll with a smooth, no-profile base element.

FIG. 4 illustrates a structured roll 32 consisting of an unprofiled smooth metal element coated with an abrasive layer. Structured roll 32 is of a type particularly suited for processing silicon wafers produced by low-cost ribbon casting. The use of silicon wafers or ribbons of such manufacture (e.g., Bayer RGS or S-Web Silicon) for this industrial solar cell production poses difficulties, due to the relatively irregular surface and surface properties (contamination of near-surface layers with impurities and relatively heavy silicon oxide layers on top of the wafers). When performing mechanical structuring with an unprofiled roll, planarization of the wafer surface with simultaneous removal of the silicon oxide coat and contaminated near-surface layers is achieved. This avoids the said problems and boosts the quality of silicon wafers made by ribbon casting.

The manufacturing method and operating mode of the present solar cell using a base element having a grid pattern is now described. Illustrated hereafter are the three embodiments I, II, and III of the present solar cell. For better understanding, the manufacturing method, which is very similar for all three embodiments, is illustrated first.

Crystalline silicon wafers (mono- or polycrystalline) serve as base material for the manufacturing process of the solar cell, with the wafer size and surface properties as well as material grade not being required to meet specific requirements. Base materials suitable for processing are:

monocrystalline silicon wafers;

wafers sawed from cast silicon blocks;

polycrystalline silicon ribbons made by precipitation from a silicon melt with a graphite lattice; and polycrystalline Si wafers obtained by precipitation of liquid silicon onto graphite slabs using a casting frame.

In the first step of the process, V-shaped grooves 12, 13 (preferably 90°) arranged on the from and back sides at a relative angle are created on both sides of the silicon wafer with the aid of a saw type forming element rotating at high speed and provided with pointed profiles (e.g., diamond saw blades extending into a point, mounted on a conventional silicon wafer saw or a structuring roll). The V-shaped grooves 12, 13 may be created using the devices illustrated in FIGS. 1–3. The depth of grooves 12, 13 depends on:

the thickness of the silicon wafer to be processed;

the groove spacing $W_R$ and $W_V$ (FIG. 6, FIG. 9) and the groove angle γ (FIG. 7); and the size of the holes 7 (FIG. 5–12) connecting the front and back side.

With Si wafers of 250 µm thickness, for example, saw blades of 80 µm thickness are used, mounted on a silicon wafer saw, having a tip angle γ of 35° and typical groove spacings $W_R$ and $W_V$ of about 100 µm, and groove depths of about 130 µm are produced. To produce the contact ridges 6, 9 required for embodiment I, the spacing $W_V$ is enlarged between two successive grooves 12, 13 that include the respective contact ridge 6, 9, as compared to the bordering grooves 12, 13.

In embodiment III, contact ridges 14, 15 are provided on one side of substrate wafer 1 as shown in FIG. 11. To simplify the separate electrical connection of the n-type and p-type contact ridges 14 and 15, respectively, required for embodiment III at the end of the solar cell processing, the structuring of the back side of the solar cell shown in FIG. 12 is used. This contact ridge arrangement is obtained by fashioning a first set of V-shaped grooves 13 that extend parallel to one another. Next, a second set of parallel grooves 13 is created in a second structuring step, with the direction of the first set of grooves 13 inscribing an angle with the second set of grooves 13. In the contact finger diffusion carried out in a following step, the contact ridges 14 extending laterally in a point, of the one side, are $n^{++}$-doped while the opposite set of ridges 15 are $p^{++}$-doped. Achieved thereby is a contact ridge arrangement, suitable for back contact solar cells, of meshing contacts of alternating charge carrier type ($n^{++}$-$p^{++}$-$n^{++}$). In addition, the electrical connection of the individual contact ridges 14, 15 of same charge carrier type is greatly simplified by the provision of bus bars 16, 17, in the present contact ridge arrangement on the outer edge of the back side of the solar cell.

As an optional subsequent process step, the sawed Si substrate may be treated in a so-called "damage getter" step, possibly in conjunction with phosphorus ("phosphorus gettering"), to the effect of augmenting the minority charge carrier diffusion length mentioned above.

The defects induced in the silicon by fashioning the grooves 12, 13 are removed in a following etching step. Using an etch solution with polishing effect, a layer depending on the grain size of the abrasive used—typically 10–20 µm thick—is etched away on both sides of the sawed silicon wafer. Suitable etches are both acid mixtures (e.g., hydrofluoric acid HF (50%), nitric acid $HNO_3$ (70%), acetic acid $CH_3COOH$ (100%) with a volume ratio of 3:43:7; etching dwell 7 to 13 minutes) and alkaline solutions (e.g., KOH or NaOH solutions).

The emitter coating 2, 8 of the solar cell is produced surface-wide, by phosphorus diffusion, on both sides of the substrate wafer 1 (in this case p-doped). The preference of p-conducting silicon wafers over n-doped base material is based on the easier manufacture as well as better surface passivation of the diffused n-layers.

Thermal oxidation of the silicon material, for passivation of the surface defects, follows as the next process step. The oxide layer 3 obtained thereby enables with film thickness optimization also an antireflection effect. The thermal oxidation can selectively be followed by a whole-area coating with a nitride (for instance, SiN). Obtained thereby is a more effective antireflection coating as compared to silicon oxide and a more efficient diffusion barrier in the following, heavy n-diffusion and p-diffusion for the emitter and basis regions.

For solar cell contacting, the solar cell regions which later need to be metallized must be rid now of silicon oxide/nitride. This bonding may be performed in various ways, as illustrated sectionally with the aid of embodiments I, II, and III.

In embodiment I, the oxide layer 3, respectively oxide and antireflection coating, at the top of contact ridges 6, 9 is removed for that purpose. This may be handled by means of a mechanical polishing process or by backfilling the grooves 12, 13 with an etch stop and subsequent removal of oxide layer 3 (respectively nitride) with the aid of appropriate etch solutions.

In embodiment II, the contact finger regions are opened by means of photolithographic steps. Diffusion procedures with high dopant concentration are then carried out on the cell, on the one side a heavy $n^{++}$-doping (selective emitter 2) and on the other a $p^{++}$-doping (basis). An $n^{++}$-coating and $p^{++}$-coating are respectively created in the contact area 4A, 11A, rid of oxide layer 3, at which time the actual high-temperature diffusion step may take place as well. The remainder of the solar cell surface is protected from undesirable diffusion of the dopants in the emitter coating 2, 8 beneath it, by the oxide layer 3 or, as the case may be, silicon nitride. The finger metallization may be produced now by non-electrical plating (e.g., Pd-Ni, Pd-Ni-Cu, Pd-Ni-Ag etc.). Another metallizing concept for the solar cell structure shown in FIG. 5 is the roll printing method illustrated in FIG. 13, which is closely related to the screen printing technology. Using a roll 18 (preferably of hard rubber), a metallic paste corresponding to that used in screen printing is rolled directly on the protruding silicon ridges 6A, 9A and processed further accordingly. Favorable in this method are the possible manufacture of minutest contact fingers 5, 10, easy transfer to industrial solar cell processing, as well as the proximity to the industrially proven screen printing technology. Lastly, the contact fingers 5, 10 are joined and the cells wired. This is accomplished, e.g., with the use of a solderable finger metallization, by soldering connector strips in place which at the same time represent the so-called "bus bar."

The popular methods for producing the contact finger metallization of a crystalline solar cell, include:

vaporization or sputtering of a metal coating or coating sequence, as the case may be, in conjunction with photolithographic process steps (10);

the screen printing method for application of a paste with metal particles mixed in, in combination with a subsequent heat treatment (7); and non-electric plating or galvanic precipitation along with previously performed photolithographic process steps (12) or laser-supported (6) or mechanical creation of contact strips 5, 10 dug in the cell.

However, these methods are not applicable, or only applicable with great expense, to the structure presented in embodiment II.

Figure 13:
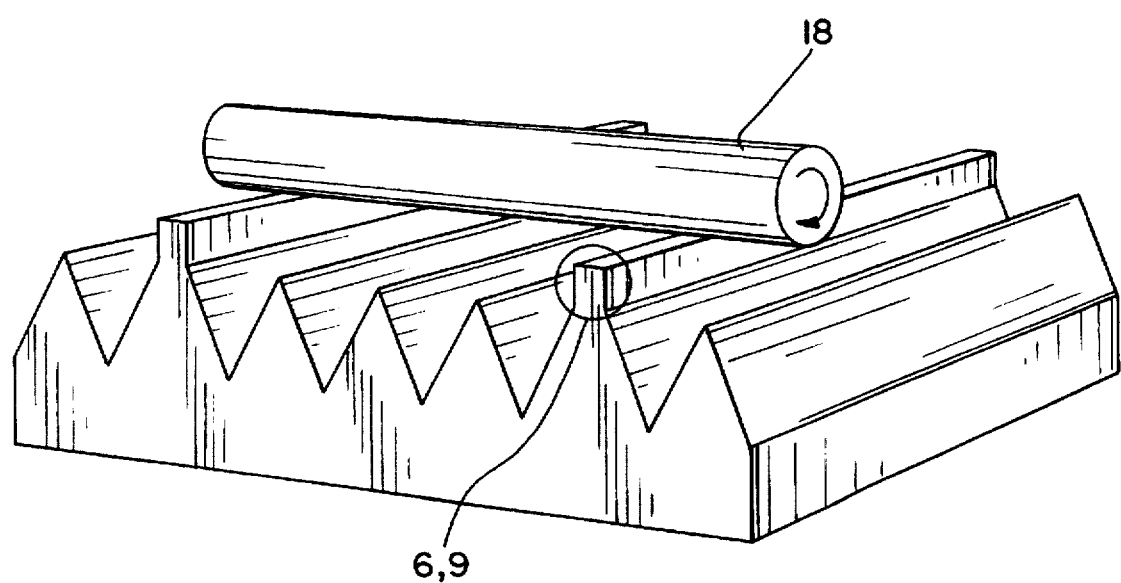
FIG. 13 shows an illustration of the roll printing method for contact finger metallization.
Figure 14:
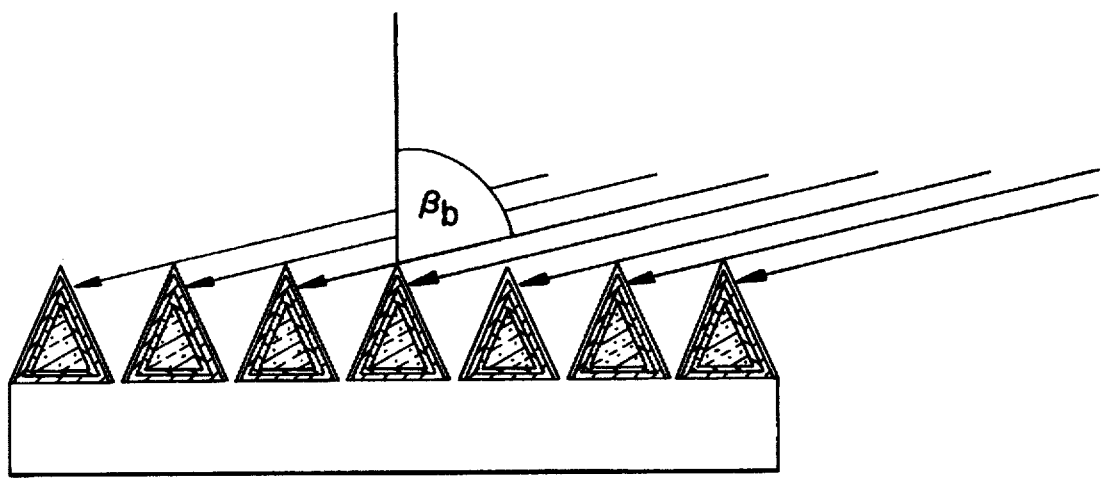
FIG. 14 shows a perspective view of the described exposure.
Figure 15:
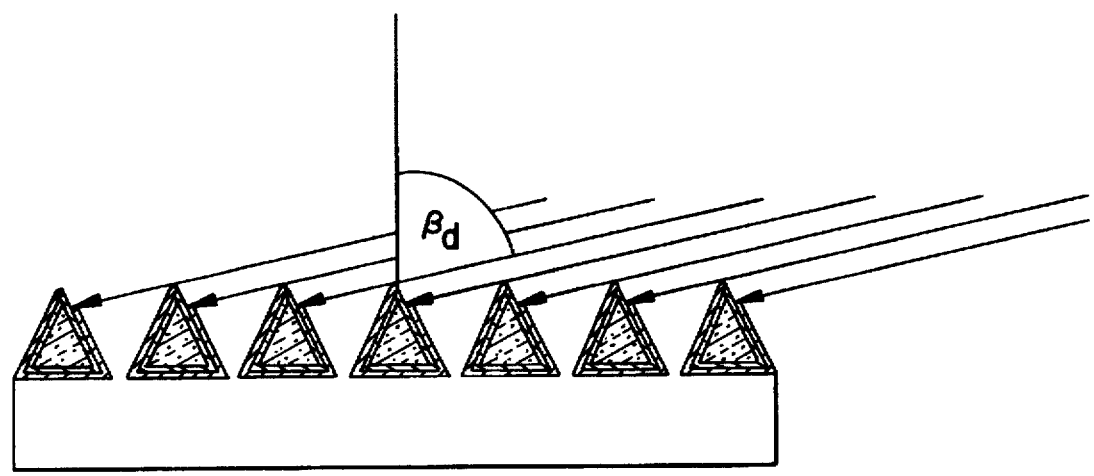
FIG. 15 shows a perspective view of the illustrated metal vaporization.

The present procedure for embodiment II is now described. After the creation of the V-shaped grooves 12, 13, after etching, after creation of emitter coating 2, 8 and oxidation layer 3, substrate wafer 1 is coated with a layer of positive photoresist in a spin-on, dipping or spray operation. The direction of pull in the dipping process should be at an angle of 45° to the groove direction, in order to accomplish a uniform wetting of the substrate wafer 1. Upon completed drying in accordance with manufacturer references, exposure is carried out according to FIG. 14 in an illuminating field of homogeneous intensity distribution. The angle $\beta_b$ can be selected depending on the desired width of contact fingers 5A, 10A in the range between 90 $\gamma/2$ (=one-half groove tip angle) and 90°. The effect of the oblique light incidence is that only a narrow strip is exposed at the top of a groove flank, since the grooves 12, 13 preceding in the ray direction shade those that follow. The same exposure is then performed on the opposite solar cell side. The exposed photoresist area is now removed in accordance with manufacturer references. With the unexposed photoresist as etch stop, the part of the solar cell surface intended for subsequent metal coating is then rid of thermal oxide layer 3 with the use of etches containing hydrofluoric acid. Prior to contact finger metallization, a selective diffusion is carried out in the contact areas 4A, 11A, whereby on one side of the solar cell an $n^{++}$-doped contact area 4A is created, a $p^{++}$-doped area 11A on the opposite side. Following an optional etching step, the metal coating is then carried out. For one, this may be a plating process utilizing the effect of a selective precipitation of metal from aqueous salt solutions on silicon rid of oxide, thus obtaining metal precipitations on the surfaces of the solar cell from which previously the thermal $SiO_2$ was removed. The desired thickness of the Ni coating allows a relatively free selection, depending on the dwell in the plating bath. The chemical nickel plating for improving the electrical conductance properties of the contact fingers 5A, 10A may be followed by a copper plating process or silver plating of the nickel-plated areas. Suitable as an alternative metallizing method is also metal vaporization. Here, the substrate wafer 1—similar to exposure of the photoresist—is tilted relative to the direction of vaporization (FIG. 14). To obtain a satisfactory metallization of the contact fingers 5A, 10A, the angle $\beta_d$ between the surface normal of the solar cell and the direction of vaporization should equal or be somewhat smaller than the exposure angle $\beta_b$ (FIG. 13, 14). As a further option, a whole-area exposure of the cell surface with the bonding metal may be performed, which coating is in a following acetone treatment removed in a lift-off step from all those spots in which photoresist was still present. Depending on selected exposure methods, a heat treatment for tempering of the contacts may follow. Next, the metal fingers are joined by a "bus bar" according to the manufacturing process described before. With plating chosen as metallizing method, this operation may be integrated in the creation of the contact fingers 5A, 10A. To that end, a strip of photoresist whose width depends on the cell size is exposed, after completed oblique irradiation of the photoresist at a now perpendicular light incidence with the use of a strip mask, orthogonally to the direction of the contact fingers 5A, 10A.

The method presented is advantageous in that both the application of the photoresist is easy to handle and the exposure is greatly facilitated by elimination of photolithographic mask adjustment.

Figure 16:
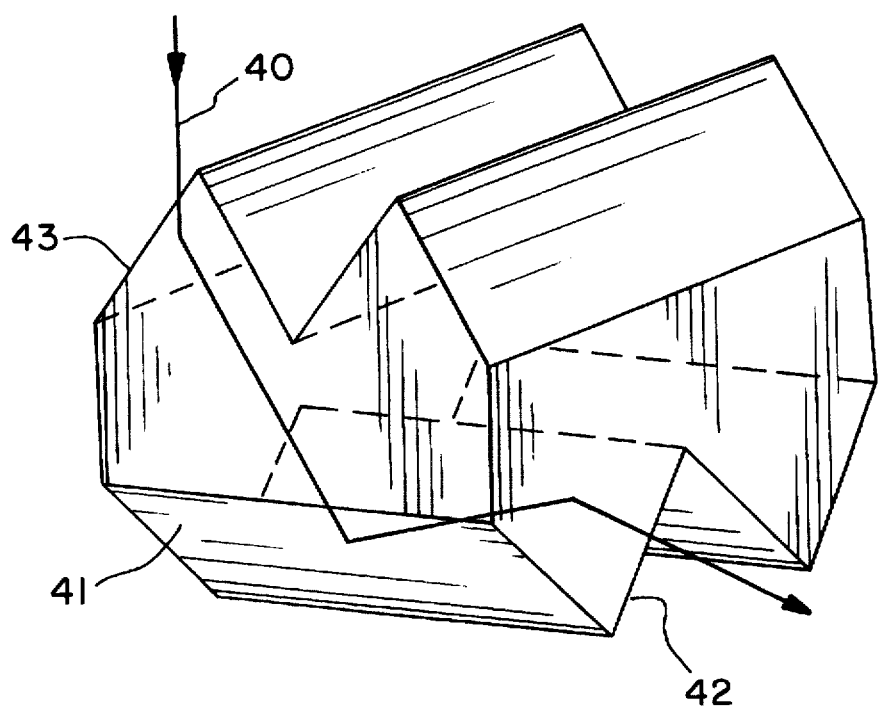
FIG. 16 illustrates the capturing of photons in solar cells according to FIGS. 5–15.

The operating mode of the present solar cell is now described with reference to FIG. 16. Light falling on the solar cell is very efficiently captured by the V-shaped profile of grooves 12, 13 on the surface of the solar cell of the present invention. As shown in FIG. 16, the efficient capture is based both on multiple reflections of the incident rays on the walls of grooves 12, 13 and on the deflection of the radiation share transmitted in the solar cell of the perpendicular direction of incidence, whereby the radiation share is very effectively captured inside the solar cell by shortfall of the limit angle of the total reflection. The path of the incident rays is illustrated with the aid of FIG. 16 with V-shaped grooves 12, 13 arranged on the front and back side at a relative angle (+), with the holes 7 according to the invention omitted for enhanced clarity. In general, a ray of long-wave light is absorbed by solar cell material only poorly and, in a conventional solar cell, issues again on the front side after passing through the cell thickness twice with reflection on the metallized (i.e., mirrored) back side. With the structure of the solar cell of the present invention, wherein the V-shaped grooves 12, 13 are perpendicularly arranged relative to one another, the captured light ray 40 is on the back side 41 of the cell deflected from the plane of incidence 43, as schematically illustrated, falls then on a further back side 42 surface and thus travels a relatively long path in the solar cell, thereby considerably increasing the probability of absorption and, thus, the sensitivity of the present solar cell in the infrared.

Optical losses occur, for one, with perpendicular light incidence due to the holes 7 that exist in the presented structure; for another, in the embodiment I, by reflection losses on the contact fingers 5. With a groove spacing of 100 μm and 5 μm (20 μm) edge length d of the holes, the share of the area covered by holes 7 amounts to 0.25 percent (4%). The area which in embodiment I is insensitive due to bonding metallization can be estimated as follows: assuming a ridge spacing a (FIG. 6) of 400 μm and a ridge width f of 10 μm, the ratio of the metal-coated area to the total area is 2.5%. In embodiment II, no losses of light power occur on the contact fingers 5, since the incident radiation is reflected directly into a bordering groove 12 and can be captured for generation of electrical power. In embodiment III, no shading losses are to be expected from cell metallization due to the placement of contact fingers 10 on the back side of the solar cell. By tilting the surface normal of the solar cell to the direction of incidence of the light entering vertically by more than one-half the groove tip angle γ, parallel to the direction of the grooves 12 facing the light, the light passage through the holes 7 in the wafer element causing the partial optical transparency is precluded extensively. Due to the relatively low optical losses in combination with the groove structure favorable for an efficient capturing of light, it becomes possible to absorb a major part of the incident sunlight in the wavelength range below 1200 nm with the solar cell. This creates charge carriers (electrons and defect electrons) in the silicon. In the p-doped substrate wafer 1 occupying the major part of the solar cell volume, the minority charge carriers generated there, electrons, diffuse to the emitter, and at that, to the front side emitter coating 2 and back side emitter coating 8. Owing to the favorable geometric makeup of the present cell structure as well as the almost whole-area fashioning of emitter coating 2, 8, distances R (FIG. 10) of less than, e.g., 35 μm need to be negotiated. Popular diffusion lengths in polycrystalline silicon, of 40 μm, hold out the expectation of high yield in collecting the generated charge carriers. A further property of the proposed solar cell conducive to this is the nearly whole-area surface passivation by means of thermal silicon oxide layer 3 and the associated reduction of the surface recombination velocity s. A low value for s across nearly the entire exterior has a positive effect in view of a high, open-terminal voltage of the illuminated cell.

The electrons that proceeded to the emitter area are now dissipated via the metal fingers 5 located over an $n^{++}$-doped area 4, and via the bus bar 16, to an outer circuit. The part of the electrons generated on the cell side opposite the $n^{++}$ contact zone must flow through the holes 7 connecting the two sides electrically. This resembles a principle that was used with the polka dot solar cell (10, 11) that was produced on monocrystalline silicon with the aid of photolithographic methods.

BIBLIOGRAPHY (1) R. F. Overstraeten, R. P. Mertens, Physics; Technology Use of Photovoltaics, Adam hilger, Bristol, 1986, 148–150.

(2) M. A. Green, High Efficiency Silicon Solar Cells, Trans Tech Publications, Kensington, 1987, pp. 208–213.

(3) A. Wang, J. Zhao, M. A. Green, Appl. Phys. Lett. 57 (6), 190, pp. 602–604.

(4) J. Wohlgemuth, A. Scheinine, Proc. 14th IEEE PVSC, San Diego, 1980, pp. 151–153.

(5) J. S. Culik, E. L. Jackson, A. M. Barnett, Proc. 20th IEEE PVSC, Kissimimee, 1990, pp. 251–256.

(6) S. Narayanan, J. Zolper, F. Yun, S. R. Wenham, A. B. Sproul, C. M. Chong, M. A. Green, Proc. 20th IEEE PVSC, Kissimimee, 1990, pp. 678–680.

(7) T. Okuno, S. Moriuchi, K. Nakajimy, Y. Yokosawa, K. Okamoto, T. Nunoi, H. Sawai, Proc. 11th EEC PVSEC, Montreux, 1992, pp. 408 ff.

(8) G. Willeke, H. Nussbaumer, H. Bender, E. Bucher, Solar Energy Materials and Solar Cells 26, North Holland, 1992, pp. 345–356.

(9) KFK News, Vol. 23, 2-3/91, pp. 165–173.

(10) R. N. Hall, T. J. Soltys, Proc. 14th IEEE PVSC, San Diego, 1980, pp. 550–553.

(11) M. A. Green, High Efficiency Silicon Cells, Trans Tech Publications, Kensington, 1987, pp. 189–191, p. 216

(12) M. A. Green, High Efficiency Silicon Cells, Trans Tech Publications, Kensington, 1987, p. 171

We claim:

1. A method for producing a solar cell comprising a semiconductor substrate in which the energy of incident rays generates charge carriers, the semiconductor substrate having contact zones with electric contacts for collection of charge carriers, comprising the step of:

creating a plurality of grooves on the front and back sides of the semiconductor substrate in generally equidistant and parallel manner, the plurality of grooves aligned and dimensioned such that the grooves on the front side and the grooves on the back side inscribe an angle relative to one another and have a depth such that through holes are created at the intersections of the grooves of the front side and the grooves of the back side.

2. The method according to claim 1, wherein said step of creating a plurality of grooves comprises mechanically creating a plurality of generally V-shaped grooves by using a saw type forming element that comprises a roll-shaped metal element that possesses the negative profile of the grooves and is coated with an abrasive.

3. The method according to claim 2, wherein the saw type forming element is rotated at a speed less than or equal to 30,000 rpm.

4. A method for metallizing a solar cell comprising a semiconductor substrate having front and back sides in which charge carriers are generated by incident ray energy, the semiconductor having grooves on the front and back sides of the semiconductor substrate, comprising the steps of:

applying a photoresist on the entire surface of one or both sides of the solar cell;

exposing the photoresist at an acute angle ($\beta_b$) with respect to a plane perpendicular to the surface of the solar cell;

removing the exposed photoresist; and performing metallization within the openings created by removing the exposed photoresist at the top of the grooves.

5. The method according to claim 4, wherein said step of performing metallization comprises performing heavy n-type diffusion on the back side and a heavy p-type diffusion prior to performing metallization on the front side.

6. A Solar cell in which charge carriers are generated by the energy of incident rays, which charge carriers are separated by an electrical field and thereafter collected via electrically conducting contacts, comprising:

a semiconductor substrate having front and back sides, said substrate having a plurality of grooves on said front and back sides, said plurality of grooves on said front side and said plurality of grooves on the back side aligned and dimensioned to form an angle relative to one another, said plurality of grooves on said front and back sides having a depth such that through holes are created at the intersections of said plurality of grooves on said front side and said plurality of grooves on said back side.

7. The solar cell according to claim 6, wherein said substrate further includes contact zones and an emitter coating on said front and back sides said emitter coating covering the surface of said substrate except the surface of said contact zones, said front side emitter coating in electrical communication with said back side emitter coating via said through holes.

8. The solar cell according to claim 7, wherein said substrate further includes a passivating coating said passivating coating covering said substrate except the surface of said contact zones.

9. The solar cell according to claim 7, wherein said contact zones are formed on one of said front side and said back side of said substrate said contact zones in alternating succession provided with an $n^{++}$-doping and a $p^{++}$-doping.

10. The solar cell according to claim 6, wherein said plurality of grooves include a plurality of adjacent grooves on said back side which are disposed to form an acute angle with each other, the space between said adjacent grooves forming contact zones that extend into a point said contact zones electrically connected by bus bars disposed on the edges of said back side.

11. The solar cell according to claim 6, wherein said plurality of grooves comprise a plurality of generally V-shaped grooves.

12. The solar cell according to claim 6, wherein said plurality of grooves comprise a plurality of grooves having a generally rectangular cross-section.

13. The solar cell according to claim 6, wherein said plurality of grooves comprise a plurality of generally U-shaped grooves.

14. The solar cell according to claim 6, wherein said plurality of grooves are disposed in generally equidistant and parallel manner on said front and back sides.

* * * * *